US012573935B2

(12) United States Patent
Zhang et al.

(10) Patent No.: US 12,573,935 B2
(45) Date of Patent: Mar. 10, 2026

(54) CURRENT SAMPLING CIRCUIT AND MULTI-LEVEL CONVERTER

(71) Applicant: Silergy Semiconductor Technology (Hangzhou) LTD, Hangzhou (CN)

(72) Inventors: Shuai Zhang, Hangzhou (CN); Wang Zhang, Hangzhou (CN); Chen Zhao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 238 days.

(21) Appl. No.: 18/135,248

(22) Filed: Apr. 17, 2023

(65) Prior Publication Data

US 2023/0344328 A1 Oct. 26, 2023

(30) Foreign Application Priority Data

Apr. 20, 2022 (CN) .......................... 202210438238.7

(51) Int. Cl.
| | |
|---|---|
| *H02M 3/158* | (2006.01) |
| *G01R 19/00* | (2006.01) |
| *H02M 1/00* | (2006.01) |

(52) U.S. Cl.
CPC ...... *H02M 1/0009* (2021.05); *G01R 19/0092* (2013.01); *H02M 3/158* (2013.01)

(58) Field of Classification Search
CPC ............. H02M 1/0009; H02M 1/0003; H02M 1/0006; H02M 3/158; H02M 3/157; H02M 3/1566; H02M 3/1563; H02M 3/156; H02M 3/155
See application file for complete search history.

(56) References Cited

U.S. PATENT DOCUMENTS

| | | | |
|---|---|---|---|
| 8,581,518 B2 | 11/2013 | Kuang et al. | |
| 2011/0127925 A1 | 6/2011 | Huang et al. | |
| 2014/0253062 A1* | 9/2014 | Qin ........................... | G05F 1/10 |
| | | | 323/282 |
| 2017/0318639 A1 | 11/2017 | Wang et al. | |
| 2018/0226877 A1* | 8/2018 | Fukumoto ........... | H02M 3/1588 |
| 2018/0295685 A1 | 10/2018 | Wang et al. | |
| 2018/0295690 A1 | 10/2018 | Chen et al. | |
| 2018/0310376 A1 | 10/2018 | Huang et al. | |
| 2021/0067041 A1* | 3/2021 | Cho ....................... | H02M 3/156 |
| 2021/0359606 A1 | 11/2021 | Han et al. | |
| 2022/0029540 A1 | 1/2022 | Zhang et al. | |

FOREIGN PATENT DOCUMENTS

| | | |
|---|---|---|
| CN | 107346940 A | 11/2017 |
| CN | 108566092 B | 9/2018 |
| CN | 112019052 A | 12/2020 |
| CN | 1112821757 A | 5/2021 |

* cited by examiner

*Primary Examiner* — Nguyen Tran

(57) ABSTRACT

A current sampling circuit for a multi-level DC-DC converter having first and second power switches connected in series, and a first inductor having one terminal coupled to a common node of the first and second power switches, where the current sampling circuit is configured to: receive a first signal representing a current flowing through the first power switch; receive a second signal representing a current flowing through the second power switch; and generate a third signal representing an inductor current flowing through the first inductor according to the first signal and the second signal.

12 Claims, 6 Drawing Sheets

CURRENT SAMPLING CIRCUIT AND MULTI-LEVEL CONVERTER

RELATED APPLICATIONS

This application claims the benefit of Chinese Patent Application No. 202210438238.7, filed on Apr. 20, 2022, which is incorporated herein by reference in its entirety.

FIELD OF THE INVENTION

The present invention generally relates to the field of power electronics, and more particularly to current sampling circuits and multi-level converters.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
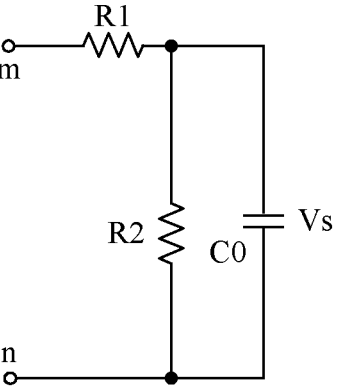
FIG. 1 is a schematic block diagram of an example current sampling circuit for a multi-level DC-DC converter.

Referring now to FIG. 1, shown is a schematic block diagram of an example current sampling circuit for a multi-level DC-DC converter. As compared against traditional converter topology, the voltage stress of the power switch in a multi-level converter is lower, which can improve the efficiency of the system, and may be suitable for medium and high power applications. In order to obtain better dynamic response performance, a current loop control can be added to the multi-level converter when an output voltage of the multi-level converter is closed-loop controlled, so an inductor current flowing through an inductor needs to be sampled. The current sampling circuit used to sample the inductor current in the multilevel converter is, e.g., as shown in FIG. 1. The current sampling circuit can include resistor R1, resistor R2, and capacitor C0. One terminal m of resistor R1 can be coupled to one terminal of the inductor in the multilevel converter. The other terminal of resistor R1 can connect with one terminal of capacitor C0. The other terminal n of capacitor C0 can be coupled to the other terminal of the inductor in the multi-level converter. Resistor R2 can connect in parallel with capacitor C0. The voltage on capacitor C0 may characterize the inductor current.

The current sampling circuit in some approaches may utilize the DC resistor of the inductor to sample the inductor current. However, problems with this approach can include the DC resistor of the inductor changing with temperature, manufacturing process, frequency and other factors, with a relatively large deviation (e.g., up to 10%), thereby affecting the sampling accuracy. When the DC resistor of the inductor is less than 1 m$\Omega$, the filtered voltage may only be a few mV, which can substantially affect the sampling accuracy. Also, more passive devices may be needed in this approach.

Figure 2:
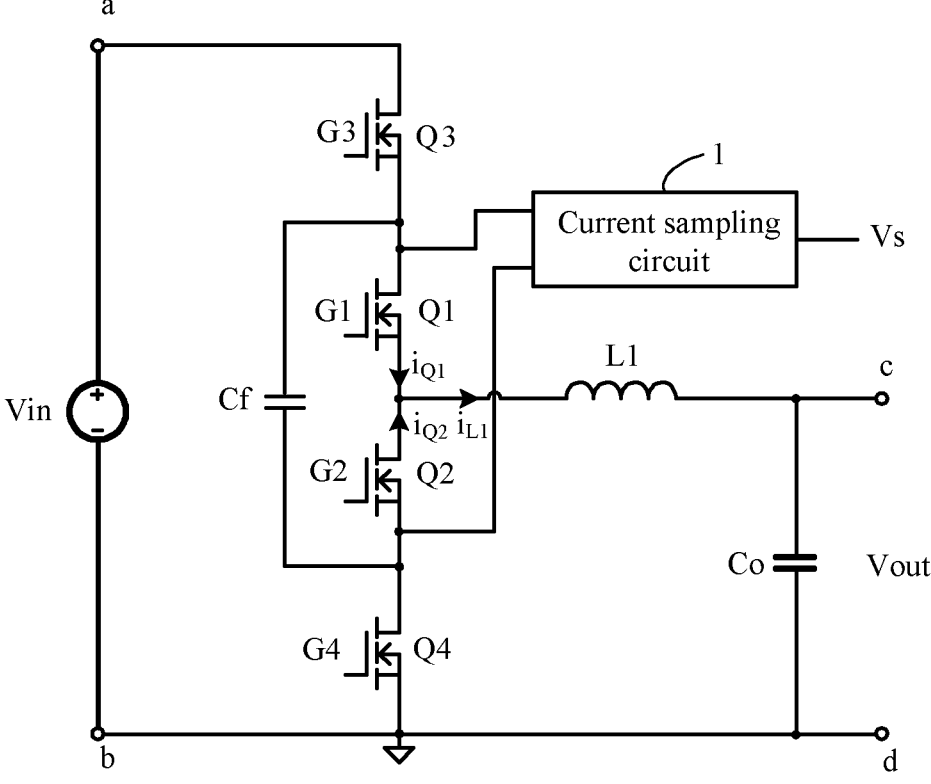
FIG. 2 is a schematic block diagram of an example multi-level DC-DC converter, in accordance with embodiments of the present invention.

Referring now to FIG. 2, shown is schematic block diagram of an example multi-level DC-DC converter, in accordance with embodiments of the present invention. This particular example multi-level converter can include positive input terminal a, negative input terminal b, positive output terminal c, negative output terminal d, power switch Q3, power switch Q1, power switch Q2, power switch Q4, flying capacitor Cf, inductor L1, and current sampling circuit 1. Positive input terminal a and negative input terminal b may receive input voltage Vin. Power switches Q1, Q2, Q3, and Q4 can connect in series between positive input terminal a and negative input terminal b. One terminal of flying capacitor Cf can be coupled to a common node of power switches Q1 and Q3. The other terminal of flying capacitor Cf can be coupled to a common node of power switches Q2 and Q4. One terminal of inductor L1 can be coupled to a common node of power switches Q1 and Q2. The other terminal of inductor L1 can be coupled to positive output terminal c.

Optionally, the multi-level converter can also include output capacitor Co, which may be coupled between positive output terminal c and negative output terminal d, in order to obtain output voltage Vout to supply power to a load. In this example, negative input terminal b and negative output terminal d may both be ground potential terminals. Current sampling circuit 1 may receive a first signal representing current iQ1 flowing through power switch Q1, and a second signal representing current iQ2 flowing through power switch Q2, and can generate signal Vs representing inductor current $i_{L1}$.

In this example, the multi-level converter is configured as a three-level converter of one stage, which is a buck topology. In other examples, the multi-level converter can be any level converter of any stage, which can be any suitable converter topology. As long as the multi-level converter includes a first structure having first and second power switches, whereby one terminal of the first inductor is coupled to the common node of the first power switch and the second power switch, the multi-level converter may utilize the current sampling method of particular embodiments in order to sample the inductor current. Further, the multi-level converter can include multiple first structures and multiple current sampling circuits. The number of the current sampling circuits can correspond to the number of the first structures to detect the current of the first inductor in each first structure.

In an embodiment, control signal G3 of power switch Q3, and control signal G4 of power switch Q4, can be complementary. Control signal G1 of power switch Q1, and control signal G2 of power switch Q2, may also be complementary. Control signal G3 of power switch Q3, and control signal G1 of power switch Q1, may have the same duty cycle. For example, the phase difference between control signal G3 of power switch Q3, and control signal G1 of power switch Q1, is 180 degrees.

Figure 3:
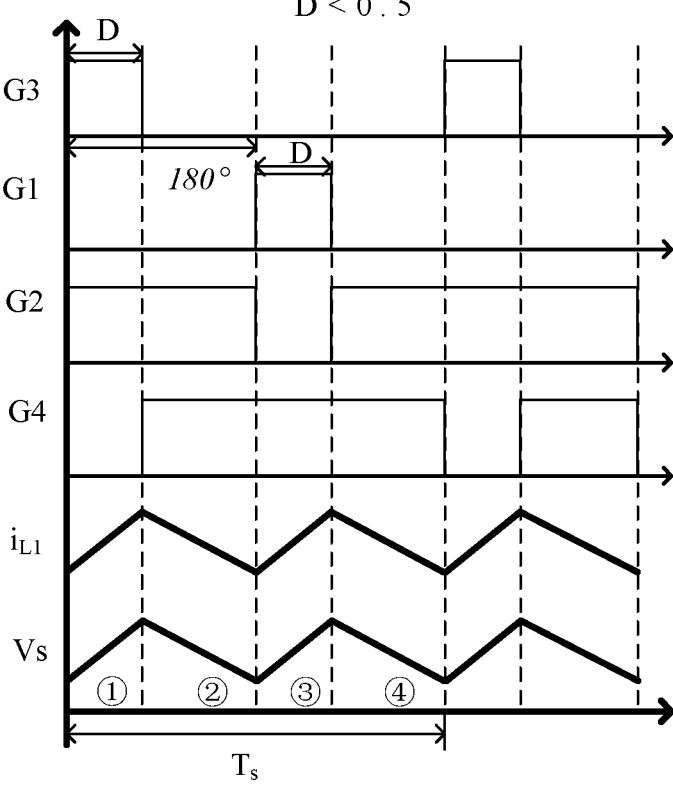
FIG. 3 is a waveform diagram of first example operation of the multi-level DC-DC converter, in accordance with embodiments of the present invention.

Referring now to FIG. 3, shown is a waveform diagram of first example operation of the multi-level DC-DC converter, in accordance with embodiments of the present invention. In this particular example, duty cycle D is less than 0.5. Here, G3, G1, G2 and G4 are the control signals of power switches Q3, Q1, Q2, and Q4, respectively. Also, $i_{L1}$ is the inductor current, and Vs is a signal characterizing inductor current $i_{L1}$. FIGS. 2 and 3 are viewed together to illustrate the operating process of the multi-level converter.

During operating interval ①, control signals G3 and G2 are high levels, and power switches Q3 and Q2 can be turned on. The operating path of the multi-level converter here is: Vin-Q3-Cf-Q2-L1-load-Vin. Input voltage Vin can charge flying capacitor Cf and inductor L1, and may supply power to the load. In this process, inductor current $i_{L1}$ rises, and inductor current $i_{L1}$ can be equal to current $i_{Q2}$ flowing through power switch Q2.

During operating interval ②, control signals G2 and G4 are high levels, and power switches Q2 and Q4 can be turned on. The operating path of the multi-level converter here is: L1-load-Q4-Q2-L1. Inductor L1 can be freewheeling to supply power to the load. In this process, inductor current $i_{L1}$ decreases, and may be equal to current $i_{Q2}$ flowing through power switch Q2.

During operating interval ③, control signals G1 and G4 are high levels, and power switches Q1 and Q4 can be turned on. The operating path of the multi-level converter here is: Cf-Q1-L1-load-Q4-Cf. The flying capacitor Cf can discharge to charge inductor L1 and supply power to the load. In this process, inductor current $i_{L1}$ rises, and can be equal to current $i_{Q1}$ flowing through power switch Q1.

During operating interval ④, control signals G2 and G4 are high levels, and power switches Q2 and Q4 can be turned on. The operating path of the multi-level converter is: L1-load-Q4-Q2-L1. Inductor L1 may be freewheeling to supply power to the load. In this process, inductor current $i_{L1}$ decreases, and can be equal to current $i_{Q2}$ flowing through power switch Q2.

In this example, operating interval ①~④ is operating cycle Ts. From the above analysis process, when power switch Q2 is turned on and power switch Q1 is turned off, inductor current $i_{L1}$ can be equal to current $i_{Q2}$ flowing through power switch Q2, and current $i_{Q1}$ flowing through power switch Q1 may be zero. When power switch Q1 is turned on and power switch Q2 is turned off, inductor current $i_{L1}$ can be equal to current $i_{Q1}$ flowing through power switch Q1, and current $i_{Q2}$ flowing through power switch Q2 may be zero. That is, inductor current $i_{L1}$ can be equal to the sum of current $i_{Q1}$ flowing through power switch Q1 and current $i_{Q2}$ flowing through power switch Q2. Thus, signal Vs characterizing inductor current $i_{L1}$ can be generated according to the first signal characterizing current $i_{Q1}$ flowing through power switch Q1 and the second signal characterizing current $i_{Q2}$ flowing through power switch Q2.

Figure 4:
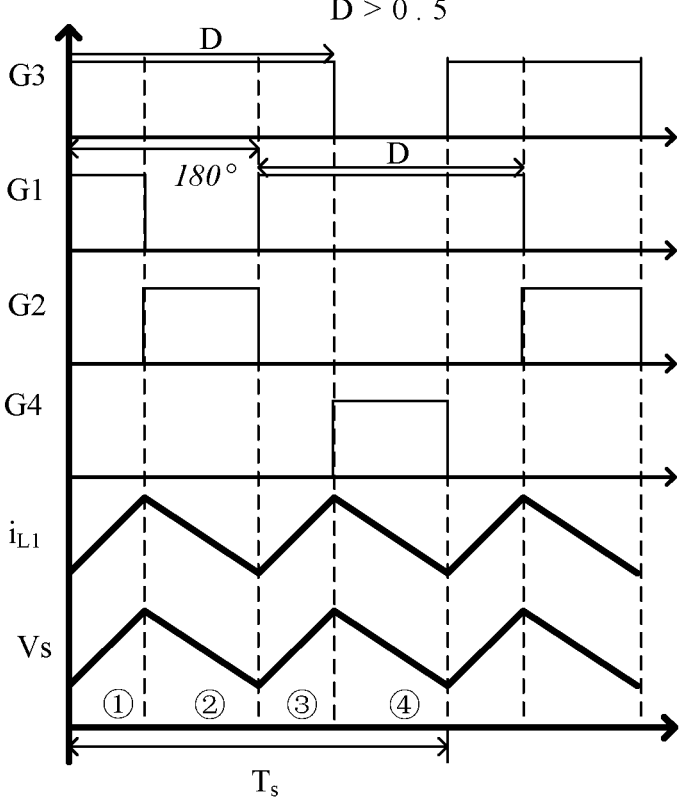
FIG. 4 is a waveform diagram of second example operation of the multi-level DC-DC converter, in accordance with embodiments of the present invention.

Referring now to FIG. 4, shown is a waveform diagram of second example operation of the multi-level DC-DC converter, in accordance with embodiments of the present invention. In this particular example, duty cycle D is greater than 0.5. Here, G3, G1, G2 and G4 are the control signals of power switches Q3, Q1, Q2, and Q4, respectively. Also, $i_{L1}$ is the inductor current, and Vs is a signal characterizing inductor current $i_{L1}$. FIGS. 2 and 4 are combined to illustrate the example operating process of the multi-level converter.

During operating interval ①, control signals G1 and G3 are high levels, and power switches Q1 and Q3 can be turned on. The operating path of the multi-level converter here is: Vin-Q3-Q1-L1-load-Vin. Input voltage Vin can charge inductor L1, and supply power to the load. In this process, inductor current $i_{L1}$ rises, and inductor current $i_{L1}$ can be equal to current $i_{Q1}$ flowing through power switch Q1.

During operating interval ②, control signals G3 and G2 are high levels, and power switches Q2 and Q3 can be turned on. The operating path of the multi-level converter here is: Vin-Q3-Cf-Q2-L1-load-Vin. Since output voltage Vout is greater than 0.5 times input voltage Vin, input voltage Vin and inductor L1 together may supply power to the load. In this process, inductor current $i_{L1}$ decreases, and can be equal to current $i_{Q2}$ flowing through power switch Q2.

During operating interval ③, control signals G1 and G3 are high levels, and power switches Q1 and Q3 can be turned on. The operating path of the multi-level converter here is: Vin-Q3-Q1-L1-load-Vin. Input voltage Vin can charge inductor L1 and may supply power to the load. In this process, inductor current $i_{L1}$ rises, and can be equal to current $i_{Q1}$ flowing through power switch Q1.

During operating interval ④, control signals G1 and G4 are high levels, power switches Q1 and Q4 can be turned on. The operating path of the multi-level converter here is: Cf-Q1-L1-load-Q4-Cf. Since output voltage Vout is greater than the voltage of flying capacitor Cf, flying capacitor Cf and inductor L1 may jointly supply power to the load. In this process, inductor current $i_{L1}$ decreases, and can be equal to current $i_{Q1}$ flowing through power switch Q1.

In this particular example, operating interval ①~④ is operating cycle Ts. From the above analysis process, when power switch Q2 is turned on and power switch Q1 is turned off, inductor current $i_{L1}$ can be equal to current $i_{Q2}$ flowing through power switch Q2, and current $i_{Q1}$ flowing through power switch Q1 may be zero. When power switch Q1 is turned on and power switch Q2 is turned off, inductor current $i_{L1}$ can be equal to current $i_{Q1}$ flowing through power switch Q1, and current $i_{Q2}$ flowing through power switch Q2 may be zero. That is, inductor current $i_{L1}$ can be equal to the sum of current $i_{Q1}$ flowing through power switch Q1 and current $i_{Q2}$ flowing through power switch Q2. Thus, signal Vs characterizing inductor current $i_{L1}$ can be generated according to the first signal characterizing current $i_{Q1}$ flowing through power switch Q1 and the second signal characterizing current $i_{Q2}$ flowing through power switch Q2.

According to the analysis of FIGS. 3 and 4, whether duty cycle D is greater than 0.5 or duty cycle D is less than 0.5, power switches Q1 and Q2 may not be turned on synchronously. When power switch Q2 is turned on, inductor current $i_{L1}$ can be equal to current $i_{Q2}$ flowing through power switch Q2. When power switch Q1 is turned on, inductor current $i_{L1}$ can be equal to current $i_{Q1}$ flowing through power switch Q1.

Figure 5:
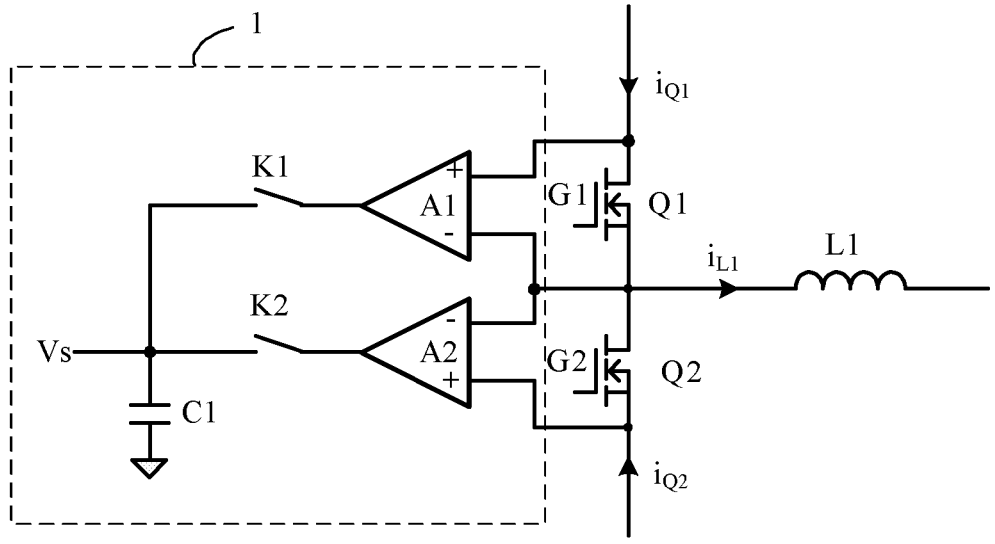
FIG. 5 is a schematic block diagram of a first example current sampling circuit, in accordance with embodiments of the present invention.

Referring now to FIG. 5, shown is a schematic block diagram of a first example current sampling circuit, in accordance with embodiments of the present invention. This particular example current sampling circuit 1 can include operational amplifier A1, operational amplifier A2, and capacitor C1. When power switch Q1 is turned on, operational amplifier A1 may receive the first signal characterizing current $i_{Q1}$ flowing through power switch Q1, and an output terminal of operational amplifier A1 can connect with a first terminal of capacitor C1, and a second terminal of capacitor C1 can be grounded. Signal Vs characterizing inductor current $i_{L1}$ may be configured as the voltage on capacitor C1. When power switch Q2 is turned on, operational amplifier A2 may receive the second signal representing current $i_{Q2}$ flowing through power switch Q2, an output terminal of operational amplifier A2 can be coupled to the first terminal of capacitor C1, and signal Vs representing inductor current $i_{L1}$ may be configured as the voltage on capacitor C1.

In this example, the first signal characterizing current $i_{Q1}$ flowing through power switch Q1 is the conduction voltage drop on power switch Q1, and the second signal characterizing current $i_{Q2}$ flowing through power switch Q2 is the conduction voltage drop of power switch Q2. Current sampling circuit 1 can also include switches K1 and K2. An inverting input terminal of operational amplifier A1 can connect to a common node of power switch Q1 and power switch Q2. A non-inverting input terminal of operational amplifier A1 can connect to the other terminal of power switch Q1, and the output terminal of operational amplifier A1 can be coupled to the first terminal of capacitor C1 through switch K1. Correspondingly, an inverting input terminal of operational amplifier A2 can connect to the common node of power switch Q1 and power switch Q2. A non-inverting input terminal of operational amplifier A2 can connect to the other terminal of power switch Q2, an output terminal of operational amplifier A2 can be coupled to the first terminal of capacitor C1 through switch K2, and the second terminal of capacitor C1 may be grounded. Signal Vs representing inductor current $i_{L1}$ can be configured as the voltage on capacitor C1.

When power switch Q1 is turned on, switch K1 can be turned on, and switch K2 may be turned off. When power switch Q2 is turned on, switch K1 can be turned off, and switch K2 may be turned on. That is, the control signal of switch K1 can be the same as control signal G1 of power switch Q1, and the control signal of switch K2 can be the same as control signal G2 of power switch Q2. In this example, switches K1 and K2 may respectively be connected to the output terminals of operational amplifiers A1 and A2. In other examples, switches K1 and K2 can be connected to other positions of operational amplifiers A1 and A2. For example, in another example, switches K1 and K2 can respectively be connected to one input terminal of operational amplifiers A1 and A2. In yet another example, operational amplifiers A1 and A2 may be replaced by a transconductance operational amplifier, and capacitor C1 can be replaced by a sampling resistor.

Figure 6:
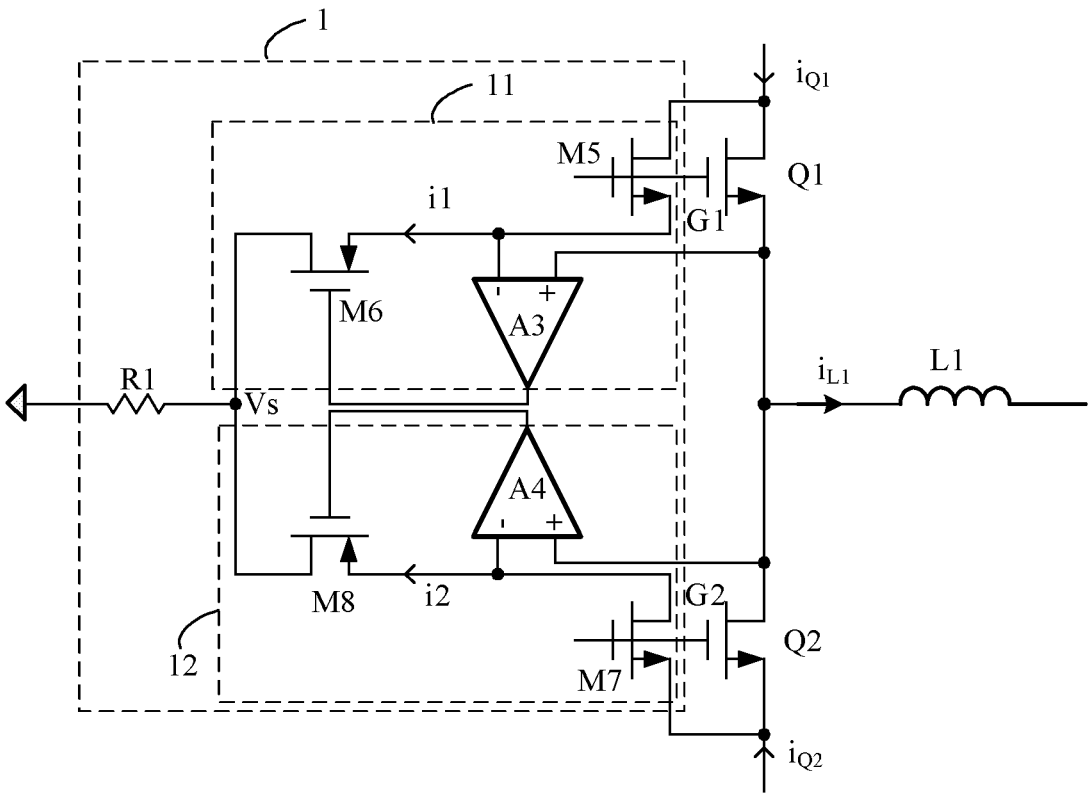
FIG. 6 is a schematic block diagram of a second example current sampling circuit, in accordance with embodiments of the present invention.

Referring now to FIG. 6, shown is a schematic block diagram of a second example current sampling circuit, in accordance with embodiments of the present invention. This particular example current sampling circuit 1 can include current mirror circuit 11, current mirror circuit 12, and resistor R1. Current mirror circuit 11 may generate mirror current i1 according to a first signal characterizing current $i_{Q1}$ flowing through power switch Q1. Mirror current i1 can be proportional to current $i_{Q1}$ flowing through power switch Q1. Current mirror circuit 12 may generate mirror current i2 according to a second signal of current $i_{Q2}$ flowing through power switch Q2, and mirror current i2 can be proportional to current $i_{Q2}$ flowing through power switch Q2. Mirror currents i1 and i2 may flow through resistor R1, respectively. Signal Vs characterizing inductor current $i_{L1}$ can be configured as the voltage drop on resistor R1. In this example, the first signal is the conduction voltage drop of power switch Q1, and the second signal is the conduction voltage drop of power switch Q2.

Further, when power switch Q1 is turned on, current $i_{Q2}$ flowing through power switch Q2 can be zero, so that mirror current i2 is zero. Thus, the current flowing through resistor R1 may be equal to mirror current i1. Similarly, when power switch Q2 is turned on, current $i_{Q1}$ flowing through power switch Q1 can be zero, and mirror current i1 is zero, such that the current flowing through resistor R1 is mirror current i2. That is, when power switch Q1 is turned on, mirror current i1 can flow through resistor R1, and signal Vs of inductor current $i_{L1}$ may be the voltage drop on resistor R1. When power switch Q2 is turned on, mirror current i2 may flow through resistor R1, and signal Vs of inductor current $i_{L1}$ can be the voltage drop on resistor R1.

Current mirror circuit 11 can include power switch M5, operational amplifier A3 and power switch M6. A first terminal of power switch M5 can connect to a first terminal of power switch Q1. A control terminal of power switch M5 can connect to a control terminal of power switch Q1. A second terminal of power switch M5 can connect to a first input terminal of operational amplifier A3. A second input terminal of operational amplifier A3 can connect to a second terminal of power switch Q1. An output terminal of operational amplifier A3 can connect to a control terminal of power switch M6. A second terminal of power switch M6 can connect to the second terminal of power switch M5, the first terminal of power switch M6 can connect to the first terminal of resistor R1, and the second terminal of resistor R1 may be grounded. Current mirror circuit 12 can include power switch M7, operational amplifier A4, and power switch M8. A second terminal of power switch M7 can connect to a second terminal of power switch Q2.

A control terminal of power switch M7 can connect to a control terminal of power switch Q2. A first terminal of power switch M7 can connect to a first input terminal of operational amplifier A4. A second input terminal of operational amplifier A4 can connect to the first terminal of power switch Q2. An output terminal of operational amplifier A4 can connect to a control terminal of power switch M8. A second terminal of power switch M8 can connect to the first terminal of power switch M7, and the first terminal of power switch M8 can connect to a common node of resistor R1 and power switch M6. In this example, the first input terminals of operational amplifiers A3 and A4 are the inverting input terminals, and the second input terminals of operational amplifiers A3 and A4 are the non-inverting input terminals, but other connections can also be supported in certain embodiments.

In this example, power switches M5 and M7 are N-type MOS transistors having a first terminal as a drain and a second terminal as a source. Also, power switches M6 and M8 are P-type MOS switches having a first terminal as a drain and a second terminal as a source. In other examples, power switches M5, M6, M7, and M8 can be power switches with similar functions, such as bipolar-junction transistors (BJTs) and other suitable transistor structures. In this example, operational amplifier A3 and power switch M6 may form a negative feedback loop to control the voltage at the second terminal of power switch M5 to be equal to the voltage at the second terminal of power switch Q1.

Since the voltage at the first terminals, the second terminals, and the control terminals of power switches Q1 and M5 are equal in this case, the current through power switch M5 is mirror current i1, and mirror current i1 is proportional to current $i_{Q1}$ flowing through power switch Q1. In an example, the conduction impedance of power switch M5 is configured to be K times the conduction impedance of power switch Q1, such that mirror current i1 is equal to 1/K of current $i_{Q1}$ flowing through power switch Q1; that is, i1=$i_{Q1}$/K. Correspondingly, operational amplifier A4 and power switch M8 may form a negative feedback loop to control that the voltage at the first terminal of power switch M7 is equal to the voltage at the first terminal of power switch Q2. Since the voltages at the first terminals, the second terminals, and the control terminals the power switches M7 and Q2 are equal in this case, the current flowing through power switch M7 is mirror current i2, and mirror current i2 is proportional to current $i_{Q2}$ flowing through power switch Q2. In an example, the conduction impedance of power switch M7 is configured to be K times the conduction impedance of power switch Q2, such that mirror current i2 is equal to 1/K of the current $i_{Q2}$ flowing through the power switch Q2; that is, i2=$i_{Q2}$/K. In this example, power switches M6 and M8 may operate in a linear state/region.

In this example, the first signal characterizing current $i_{Q1}$ flowing through power switch Q1 is the conduction voltage drop on power switch Q1, and the second signal that characterizes current $i_{Q2}$ flowing through power switch Q2 is the conduction voltage drop on power switch Q2. However, in other examples, the first signal can be other signal(s) that characterize current $i_{Q1}$ flowing through power switch Q1, and the second signal can be other signal(s) that characterize current $i_{Q2}$ flowing through power switch Q2. For example, the first signal is current $i_{Q1}$, and the second signal is current $i_{Q2}$.

In one example, voltage sampling circuit 1 can be integrated in an integrated circuit. In another example, at least part of the device in voltage sampling circuit 1 (e.g., all devices except the sampling resistor or resistor R1), power switch Q1, and power switch Q2 can be integrated in an integrated circuit. In addition, the multi-level converter can also include a control circuit configured to generate a control signal based on the output voltage of the multi-level converter and the signal representing the inductor current generated by current sampling circuit 1, in order to control the switching state of each power switch in the multi-level converter. Further, the control circuit can be configured as follows: the first error signal may be generated according to the output voltage and an output voltage reference signal of the multi-level converter, and the control signal may be generated according to a first error signal and the signal representing the inductor current. For example, the first error signal is configured as the difference between the output voltage and the output voltage reference signal of the multi-level converter.

In one example, the control circuit can be configured as follows: the first error signal may be generated according to the output voltage and the output voltage reference signal of the multi-level converter. Also, the first error signal can be processed by proportional-integral (PI) compensation, and a second error signal may be generated according to the first error signal after PI processing and the signal representing the inductor current. For example, the second error signal can be configured as the difference between the first error signal processed by PI and the signal representing the inductor current. The control signal can be generated according to the second error signal after PI processing and a slope signal. In another example, the control circuit may generate the first error signal according to the output voltage and the output voltage reference signal of the multi-level converter. The first error signal after PI processing and the signal representing the inductor current can be compared, in order to generate the control signal. Further, the control circuit can include a SR flip-flop. The first error signal after PI processing and the signal characterizing the inductor current can be compared, in order to generate a reset signal of the SR flip-flop, and a set signal of the SR flip-flop may be generated according to a clock signal.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A current sampling circuit for a multi-level DC-DC converter having first and second power switches connected in series, and a first inductor having one terminal coupled to a common node of the first and second power switches, wherein the current sampling circuit is configured to:
   a) receive a first signal representing a current flowing through the first power switch;
   b) receive a second signal representing a current flowing through the second power switch;
   c) generate a third signal representing an inductor current flowing through the first inductor according to the first signal and the second signal; and
   d) wherein the current sampling circuit comprises first and second operational amplifiers that each have a non-inverting input terminal directly connected to the common node of the first and second power switches, and an inverting input terminal that is not directly connected to either of the first and second power switches.

2. The current sampling circuit of claim 1, wherein the current sampling circuit is configured to:
   a) when the first power switch is turned on, generate the third signal representing the inductor current flowing through the first inductor according to the first signal representing the current flowing through the first power switch; and
   b) when the second power switch is turned on, generate the third signal representing the inductor current flowing through the first inductor according to the second signal representing the current flowing through the second power switch.

3. The current sampling circuit of claim 1, wherein the first signal is a conduction voltage drop of the first power switch, and the second signal is a conduction voltage drop of the second power switch.

4. The current sampling circuit of claim 1, wherein the first power switch and the second power switch are not simultaneously turned on.

5. The current sampling circuit of claim 1, wherein:
   a) the current sampling circuit comprises a first current mirror circuit and a second current mirror circuit;

b) the first current mirror circuit is configured to generate a first mirror current according to the first signal representing the current flowing through the first power switch;

c) the second current mirror circuit is configured to generate a second mirror current according to the second signal that characterizes the current flowing through the second power switch; and d) the first mirror current is proportional to the current flowing through the first power switch, the second mirror current is proportional to the current flowing through the second power switch, and the third signal representing the inductor current flowing through the first inductor is generated according to the first mirror current and the second mirror current.

6. The current sampling circuit of claim 5, wherein:

a) the current sampling circuit comprises a first resistor;

b) the first mirror current and the second mirror current respectively flow through the first resistor; and c) the third signal characterizing the inductor current is configured as a voltage drop on the first resistor.

7. The current sampling circuit of claim 6, wherein:

a) when the first power switch is turned on, the first mirror current flows through the first resistor; and b) when the second power switch is turned on, the second mirror current flows through the first resistor.

8. The current sampling circuit of claim 5, wherein:

a) the first current mirror circuit comprises a fifth power switch, the first operational amplifier, and a sixth power switch, a first terminal of the fifth power switch is coupled to a first terminal of the first power switch, a control terminal of the fifth power switch is coupled to a control terminal of the first power switch, the first operational amplifier and the sixth power switch form a negative feedback loop to make a voltage at a second terminal of the fifth power switch equal to a voltage at a second terminal of the first power switch, and the first mirror current is a current flowing through the fifth power switch; and b) the second current mirror circuit comprises a seventh power switch, the second operational amplifier, and an eighth power switch, a second terminal of the seventh power switch is coupled to a second terminal of the second power switch, a control terminal of the seventh power switch is coupled to a control terminal of the second power switch, the second operational amplifier and the eighth power switch form a negative feedback loop to make a voltage at a first terminal of the seventh power switch is equal to a voltage at a second terminal of the second power switch, and the second mirror current is a current flowing through the seventh power switch.

9. The current sampling circuit of claim 8, wherein:

a) two input terminals of the first operational amplifier are respectively coupled to the second terminal of the fifth power switch and the second terminal of the first power switch, an output terminal of the first operational amplifier is coupled to a control terminal of the sixth power switch, a second terminal of the sixth power switch is coupled to the second terminal of the fifth power switch, and a first terminal of the sixth power switch is coupled to a first terminal of the first resistor; and b) two input terminals of the second operational amplifier are respectively coupled to the first terminal of the seventh power switch and the first terminal of the second power switch, an output terminal of the second operational amplifier is coupled to a control terminal of the eighth power switch, a second terminal of the eighth power switch is coupled to the first terminal of the seventh power switch, and a first terminal of the eighth power switch is coupled to a first terminal of the first resistor.

10. The current sampling circuit of claim 9, wherein the sixth power switch and the eighth power switch each operate in a linear state.

11. A power converter, comprising the multi-level DC-DC converter and the current sampling circuit of claim 1.

12. An integrated circuit, comprising the first and second power switches of the multi-level DC-DC converter, and one or more of devices in the current sampling circuit of claim 1.

* * * * *